United States Patent [19]

Sasaki et al.

[11] Patent Number: 5,605,576
[45] Date of Patent: Feb. 25, 1997

[54] HIGH FREQUENCY MAGNETRON PLASMA APPARATUS

[75] Inventors: Makoto Sasaki, Sendai; Hirofumi Fukui, Taiwa-machi; Masami Aihara, Sendai; Tadahiro Ohmi, 1-7 Yukigaya, Otsuka-Cho, Ota-ku, Tokyo, all of Japan

[73] Assignees: Frontec Incorporated; Tadahiro Ohmi, both of Sendai, Japan

[21] Appl. No.: 336,631

[22] Filed: Nov. 9, 1994

[30] Foreign Application Priority Data

Nov. 11, 1993 [JP] Japan .................. 5-282723

[51] Int. Cl.⁶ .................................. C23C 16/00
[52] U.S. Cl. .................... 118/723 E; 118/723 MA; 156/345; 204/298.11
[58] Field of Search .............. 118/723 E, 723 MA; 156/345; 204/298.16, 298.19, 298.37, 298.11

[56] References Cited

U.S. PATENT DOCUMENTS

| | | | |
|---|---|---|---|
| 4,155,825 | 5/1979 | Fournier | 204/192 R |
| 4,576,700 | 3/1986 | Kadokura | 204/192 M |
| 4,865,709 | 9/1989 | Nakagawa | 204/192.12 |
| 4,957,605 | 9/1990 | Kurwitt | 204/192.12 |
| 5,376,211 | 12/1994 | Harada | 156/345 |
| 5,397,448 | 3/1995 | Gesche | 204/298.16 |

OTHER PUBLICATIONS

Advanced Plasma Processing Equipment without Water Surface Damage and chamber Material Contamination; Authors: H. Goto, M. Sasaki, T. Ohmi, T. Shibata, A. Yamagami, N. Okamura and O. Kamiya; pp. 606, 607.

Primary Examiner—R. Bruce Breneman
Assistant Examiner—Joni Y. Chang
Attorney, Agent, or Firm—Guy W. Shoup; Patrick T. Bever

[57] ABSTRACT

An object of the present invention is to increase the energy efficiency of a plasma apparatus and provide a high-frequency magnetron plasma apparatus which can precisely control plasma. The plasma apparatus has a susceptor electrode, a plasma exciting electrode, magnets mounted on the plasma exciting electrode, and a magnetic shield provided around the plasma exciting electrode, all of which are arranged in a vacuum chamber. The magnetic shield has a high impedance for a high frequency. The magnetic shield is preferably earthed with a direct current, more preferably earthed through an inductance.

6 Claims, 4 Drawing Sheets

HIGH FREQUENCY MAGNETRON PLASMA APPARATUS

BACKGROUND OF THE INVENTION

1. Field of the Invention

The present invention relates to a high-frequency magnetron plasma apparatus, and particularly to the construction of a magnetic shield disposed in a high-frequency magnetron plasma apparatus.

2. Description of the Related Art

FIG. 5 illustrates an example of conventional high-frequency magnetron plasma apparatus. Where plasma is excited by using the apparatus shown in FIG. 5, a gas is introduced into a vacuum chamber 501 having a gas inlet tube 512 and a gas discharge opening 513, and high-frequency electric power is applied to a plasma exciting electrode 502 from a high-frequency power source 508 through a matching box 507 to excite the plasma between the plasma exciting electrode 502 and a susceptor electrode 509.

Magnets 504 are disposed in the plasma exciting electrode 502 in order to increase the density of the plasma between both electrodes, and a magnetic shield 505 for preventing leakage of a magnetic field, comprising a high-permeability material is also provided for preventing the magnetic field from leaking to the vicinity of the plasma exciting electrode and the plasma from extending thereto. The susceptor electrode 509 is earthed through a band pass filter 510, a high-frequency ammeter 511 for measuring the susceptor current being provided in the course of earth. Reference numeral 506 denotes an insulator for insulating the vacuum chamber 501 from the electrodes.

SUMMARY OF THE INVENTION

In the process of examining precision control of plasma by using the plasma apparatus having the above structure, the inventors found that the current flowing through the susceptor electrode significantly decreases under a pressure, i.e., that the plasma cannot be precisely controlled because RF power is not supplied to the plasma space.

The present invention has been achieved on the basis of this finding, and it is an object of the invention to increase the energy efficiency of a plasma apparatus and provide a high-frequency magnetron plasma apparatus which can precisely control plasma.

In order to achieve the object, the present invention provides a high-frequency magnetron plasma apparatus comprising a susceptor electrode, a plasma exciting electrode, magnets provided on the plasma exciting electrode, and a magnetic shield disposed around the plasma exciting electrode, all of which are arranged in a vacuum chamber, wherein the magnetic shield has a high impedance for a high frequency.

The magnetic shield is preferably earthed with direct current, and preferably earthed through an inductance.

Since a conventional magnetic shield plate is earthed with a high frequency, the phenomenon that high-frequency electric power leaks to the earth through the capacity formed between the plasma exciting electrode (in sputtering, including a target) and the magnetic shield takes place. However, it is possible to prevent the leakage of high-frequency electric power through the magnetic shield by bringing the magnetic shield near a floating state with respect to a high frequency. It is consequently possible to significantly increase the efficiency of utilization of high-frequency energy, correctly monitor the high-frequency current and thus precisely control plasma.

Where the magnetic shield is brought into a floating state with direct current, the magnetic shield plate is biased by itself to a negative potential. Since this results in sputtering of the material of the magnetic shield, and contamination of the plasma atmosphere and the substrate, the magnetic shield is preferably earthed with direct current. However, when contamination is not a problem, the magnetic shield plate may be brought into a floating state with direct current and high frequency.

Any desired structure can be used for the magnetic shield of the present invention so far as the structure have a high frequency impedance between the magnetic shield and the earth. Although a preferred impedance depend upon the structure of the apparatus, the impedance is generally 1 KΩ or more.

The magnetic shield may be earthed with direct current and provided with a high impedance for a high frequency by employing a structure with notches, as shown in FIG. 4, a mesh structure, a method in which the magnetic shield plate is earthed through a coil, or a structure comprising combination thereof.

Although a sputtering apparatus can be exemplified as the high frequency magnetron plasma apparatus, an apparatus is not limited to this, and, for example, an etching apparatus, a plasma CVD apparatus, etc. have the same effects.

DESCRIPTION OF THE PREFERRED EMBODIMENTS

Although the present invention is described in detail below with reference to embodiments, the present invention is not limited to these embodiments.

EMBODIMENT 1

Figure 1:
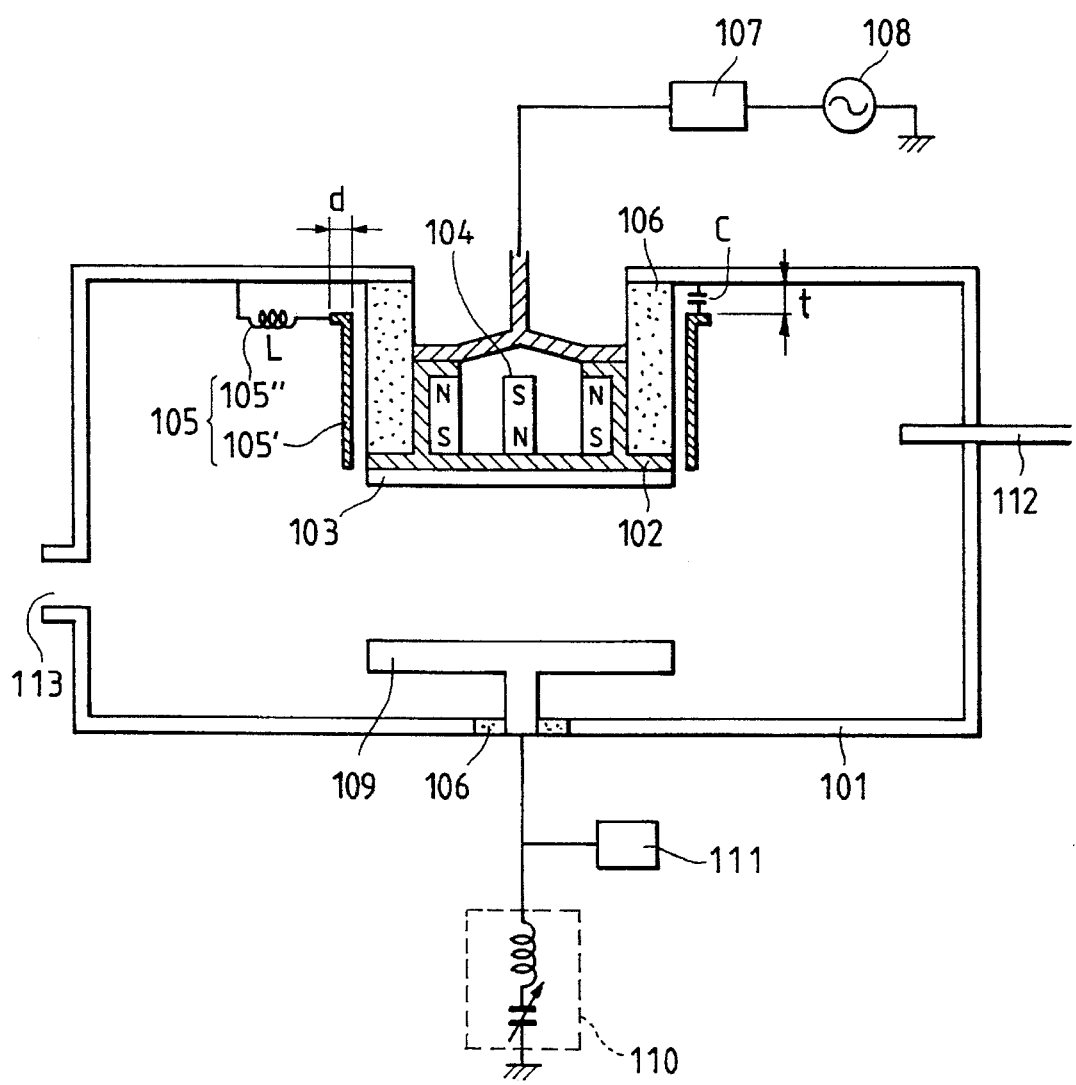
FIG. 1 is a conceptual drawing illustrating a high-frequency magnetron plasma apparatus in accordance with Embodiment 1.

The relation between high-frequency electric power and the current flowing through a susceptor electrode was examined by using the high-frequency magnetron plasma apparatus illustrated in FIG. 1.

In FIG. 1, reference numeral 101 denotes a vacuum chamber having a gas inlet tube 112 and a discharge opening 113; reference numeral 102, a plasma exciting electrode; reference numeral 103, an inch-diameter target; reference numeral 104, a magnet; reference numeral 105, a magnetic shield; reference numeral 106, an insulator; reference numeral 107, a matching box; and reference numeral 108, a high-frequency power source. Reference numeral 109 denotes a susceptor electrode which is connected to an earth through a band pass filter 110. A high-frequency ammeter (Royal-FR20 produced by Royal Corp.) for measuring the current flowing through the susceptor electrode is also disposed on the earth.

The magnetic shield 105 of this embodiment has a cylindrical magnetic shield plate (made of permalloy) 105' having an edge (d=1 cm), provided at a distance (t=1 cm) from the upper wall of the vacuum chamber 101, and connected to the upper wall (earth) through a coil 105". In this structure, the capacity C between the magnetic shield plate and the upper wall of the vacuum chamber is about 3 pF. The conductance L of the coil 105" is determined so as to satisfy the condition for parallel resonance, i.e., the following condition for a high frequency of 13.56 MHz:

$$L=1/C\omega^2=45 \ \mu H$$

Ar gas was introduced into the vacuum chamber 101 through the gas inlet tube 112 from a gas supply source (not shown), and the pressure in the vacuum chamber was kept at 10 mTorr.

A high frequency of 13.56 MHz was applied to the plasma exciting electrode 102 with various power values from the high-frequency power source 108 to excite plasma, and the high frequency current flowing through the susceptor electrode 109 was measured by the ammeter 111. The results obtained are shown by a solid line in FIG. 2.

Figure 5:
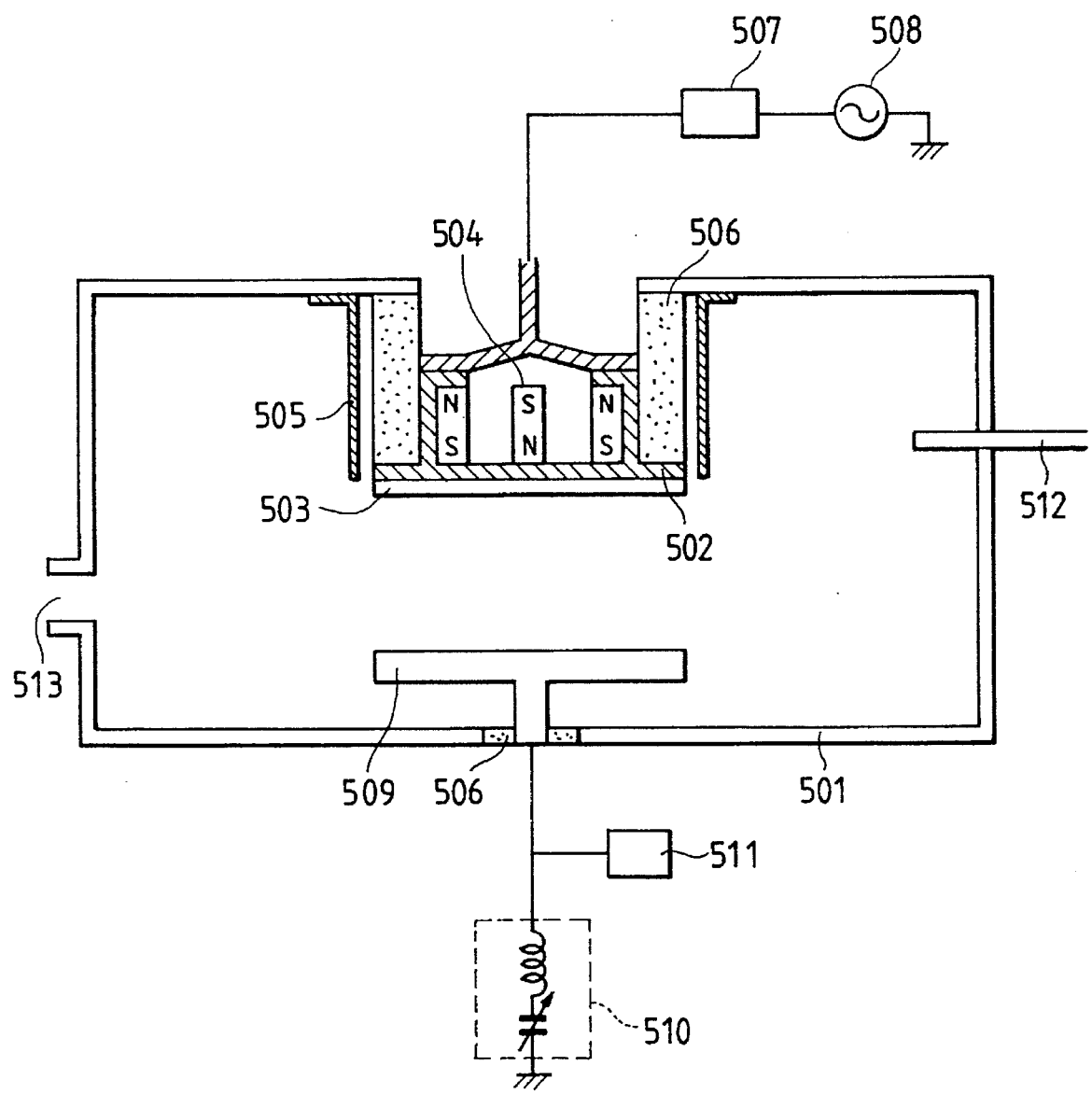
FIG. 5 is a conceptual drawing illustrating a conventional high-frequency magnetron plasma apparatus.

For comparison, similarly, the relation between the susceptor current and high-frequency electric power was measured for a conventional example using the apparatus illustrated in FIG. 5 in which a magnetic shield plate was provided directly on a vacuum chamber, and is earthed with direct current and high frequency. The results obtained are shown by a broken line in FIG. 2.

Figure 2:
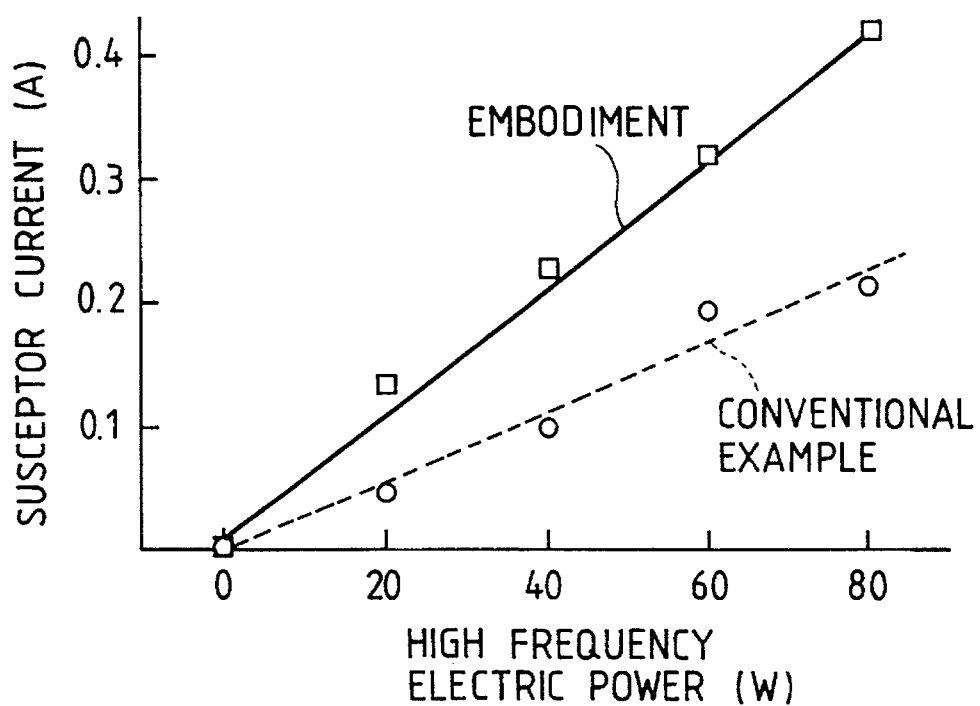
FIG. 2 is a graph illustrating the relation between high-frequency electric power and susceptor current.

As illustrated in FIG. 2, in both the embodiment and the conventional example, the susceptor current increases with increases in the high-frequency electric power. However, in this embodiment, the current value is clearly very larger than that of the conventional example. This indicates that the structure of this embodiment has the effect of preventing leakage of the high-frequency electric power through the magnetic shield.

EMBODIMENT 2

4-inch $Ta_2O_5$ as a target 103 was set in the plasma apparatus illustrated in FIG. 1 to form a $Ta_2O_5$ film of 200 nm (Sample 1).

A $Ta_2O_5$ film of 200 nm (Sample 2) was formed by the same method as that described above except that the magnetic shield coil shown in FIG. 1 was removed, and a quartz plate was inserted between the magnetic shield plate and the vacuum chamber and floated with direct current and high-frequency and used as a magnetic shield.

20 films of each sample were formed and measured with respect to dielectric withstand voltage. FIG. 3 shows a histogram showing dielectric withstand voltages and frequencies thereof. The dielectric withstand voltage was defined as a voltage value at which a current of 1 A/cm² flowed when a voltage was applied to a film.

Figure 3A:
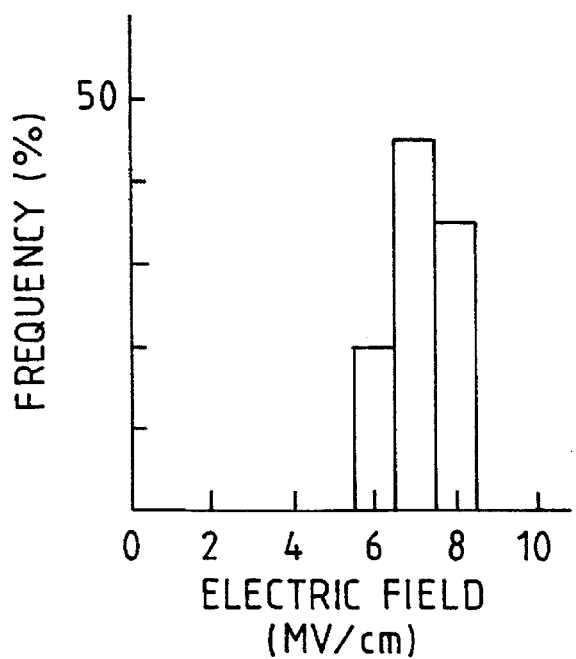
FIG. 3 is a histogram for dielectric withstand voltages and insulating films.
Figure 3B:
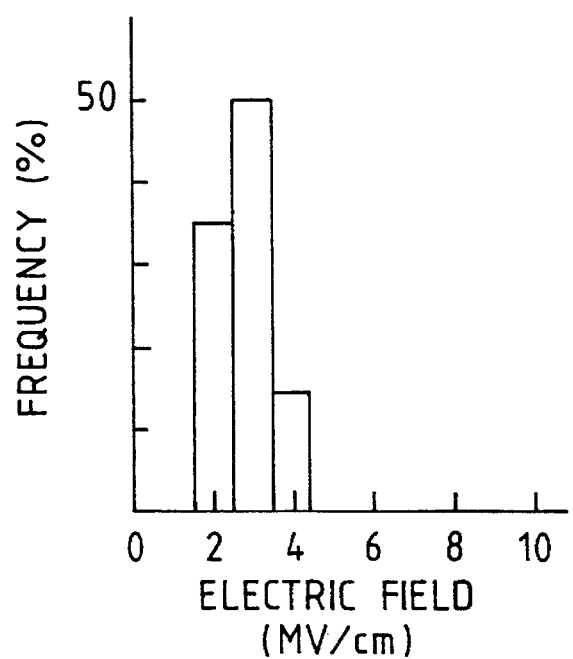
Figure 4A:
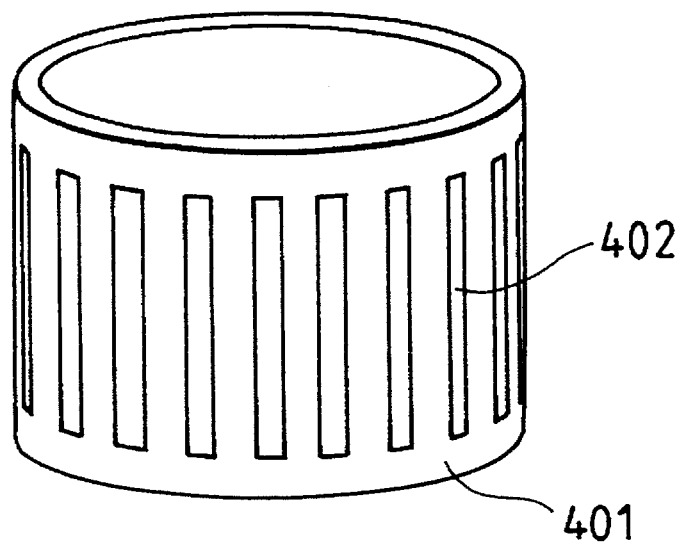
FIG. 4 is a conceptual drawing illustrating examples of a magnetic shield.
Figure 4B:
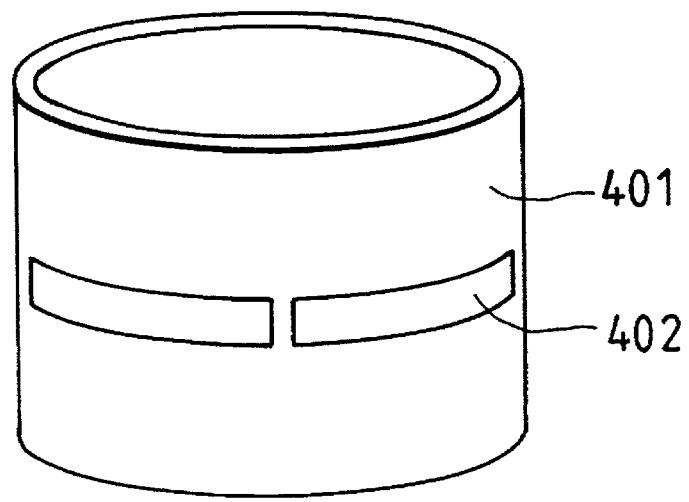

As seen from FIG. 3, the dielectric withstand voltage when the magnetic shield is earthed with direct current (FIG. 3(a)) is higher than that when the magnetic shield is floated with direct current and high frequencies (FIG. 3(b)). This is possibly caused by the state wherein when the magnetic shield is floated with direct current, the magnetic shield is at a negative bias potential, and thus sputtered to contaminate the $Ta_2O_5$ film, thereby decreasing the dielectric withstand voltage.

Although, in the above embodiments, a frequency of 13.56 MHz was used as the frequency of the high-frequency power source, the present invention is not limited to this frequency, and the same effect can be obtained by appropriately selecting a coil inductance even with a frequency of 1 MHz to 3 MHz.

Since the high-frequency impedance between the magnetic shield plate and the earth is high, it is possible to prevent leakage of the high-frequency electric power passing through the magnetic shield plate. Thus, the efficiency of utilization of energy can be increased.

Further, since the high-frequency electric power can correctly be monitored from the outside, it is possible to precisely control a plasma apparatus and improve film quality.

What is claimed is:

1. A high-frequency magnetron plasma apparatus comprising a susceptor electrode, a plasma exciting electrode, magnets mounted on said plasma exciting electrodes, and a magnetic shield formed from a high-permeability material disposed around said plasma exciting electrode, all of which are arranged in a vacuum chamber, wherein said magnetic shield has a high impedance relative to earth at high frequencies.

2. A high-frequency magnetron plasma apparatus according to claim 1, wherein said magnetic shield is earthed with a direct current.

3. A high frequency magnetron plasma apparatus comprising a susceptor electrode, a plasma exciting electrode, magnets mounted on said plasma exciting electrodes, and a magnetic shield disposed around said plasma exciting electrode, all of which are arranged in a vacuum chamber, wherein said magnetic shield has a high impedance for a high frequency, and wherein said magnetic shield is earthed through an inductance.

4. A high-frequency magnetron plasma apparatus according to claim 1, wherein said magnetic shield includes a cylindrical magnetic shield plate having at least one notch formed therein.

5. A high-frequency magnetron plasma apparatus according to claim 1, wherein said magnetic shield has a meshed structure.

6. A high-frequency magnetron plasma apparatus according to claim 1, wherein said magnetic shield is earthed through a coil.

\* \* \* \* \*